United States Patent
Wu et al.

(10) Patent No.: US 11,982,725 B2
(45) Date of Patent: May 14, 2024

(54) PARALLEL TRANSMISSION MAGNETIC RESONANCE IMAGING WITH A SINGLE TRANSMISSION CHANNEL RF COIL USING DEEP LEARNING

(71) Applicant: Regents of the University of Minnesota, Minneapolis, MN (US)

(72) Inventors: Xiaoping Wu, Minneapolis, MN (US); Xiaodong Ma, Minneapolis, MN (US); Kamil Ugurbil, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 76 days.

(21) Appl. No.: 17/734,776

(22) Filed: May 2, 2022

(65) Prior Publication Data

US 2022/0357415 A1 Nov. 10, 2022

Related U.S. Application Data

(60) Provisional application No. 63/182,704, filed on Apr. 30, 2021.

(51) Int. Cl.
*G01R 33/56* (2006.01)
*G06N 3/045* (2023.01)
*G06N 3/088* (2023.01)

(52) U.S. Cl.
CPC ......... *G01R 33/5608* (2013.01); *G06N 3/045* (2023.01); *G06N 3/088* (2013.01)

(58) Field of Classification Search
CPC ............ G01R 33/5608; G01R 33/5659; G06N 3/045; G06N 3/088; G06N 3/0985;
(Continued)

(56) References Cited

U.S. PATENT DOCUMENTS

2008/0218506 A1* 9/2008 Doyle ................ G01R 33/5611
345/418
2016/0350919 A1 12/2016 Steigauf et al.
(Continued)

FOREIGN PATENT DOCUMENTS

CN 109685737 A 4/2019
DE 102014215531 A1 2/2016
(Continued)

OTHER PUBLICATIONS

Adriany et al., Transmit and Receive Transmission Line Arrays for 7 Tesla Parallel Imaging, Magnetic Resonance in Medicine, 2005, 53(2):434-445.
(Continued)

*Primary Examiner* — G. M. A Hyder
(74) *Attorney, Agent, or Firm* — QUARLES & BRADY LLP

(57) ABSTRACT

Magnetic resonance images with improved image quality consistent with those obtained using parallel radio frequency ("RF") transmission ("pTx") techniques are generated from data acquired using single transmission hardware (e.g., single channel RF transmission). A deep-learning framework is used to train a deep neural network to convert images obtained with single transmission into pTx-like images. The pTx-like images have reduced signal variations and dropouts that may otherwise be attributable to B1+ inhomogeneities.

18 Claims, 10 Drawing Sheets

(58) Field of Classification Search
CPC .. G06N 3/0464; G06N 3/0475; G06N 3/0455; G06N 3/084

See application file for complete search history.

(56) References Cited

U.S. PATENT DOCUMENTS

| | | | |
|---|---|---|---|
| 2021/0165064 A1* | 6/2021 | Chen | G06N 3/084 |
| 2023/0122658 A1* | 4/2023 | Kamilov | G01R 33/5608 382/131 |

FOREIGN PATENT DOCUMENTS

| | | |
|---|---|---|
| WO | 2017223560 A1 | 12/2017 |
| WO | 2020028382 A1 | 2/2020 |

OTHER PUBLICATIONS

Aigner et al., Calibration-Free pTx of the Human Heart at 7T via 3D Universal Pulses, Magnetic Resonance in Medicine, 2022, 87(1):70-84.

Cawley et al., On Over-Fitting in Model Selection and Subsequent Selection Bias in Performance Evaluation, The Journal of Machine Learning Research, 2010, 11:2079-2107.

Cloos et al., kT-Points: Short Three-Dimensional Tailored RF Pulses for Flip-Angle Homogenization Over an Extended Volume, Magnetic Resonance in Medicine, 2012, 67(1):72-80.

Cloos et al., Parallel-Transmission-Enabled Magnetization-Prepared Rapid Gradient-Echo T1-Weighted Imaging of the Human Brain at 7T, Neuroimage, 2012, 62(3):2140-2150.

Glasser et al., The Minimal Preprocessing Pipelines for the Human Connectome Project, Neuroimage, 2013, 80:105-124.

Gong et al., Improving the Pi + cs Reconstruction for Highly Undersampled Multi-Contrast MRI Using Local Deep Network, Proceedings of the International Society for Magnetic Resonance in Medicine, 2017, 25, 3 pages.

Goodfellow et al., Generative Adversarial Nets, Advances in Neural Information Processing Systems, 2014, 27:1-9.

Goodfellow et al., Generative Adversarial Networks, Communications of the ACM, 2020, 63(11): 139-144.

Gras et al., Universal Pulses: A New Concept for Calibration-Free Parallel Transmission, Magnetic Resonance in Medicine, 2017, 77(2):635-643.

Gras et al., Design of Universal Parallel-Transmit Refocusing KT-Point Pulses and Application to 3D T2-Weighted Imaging at 7T, Magnetic Resonance in Medicine, 2018, 80(1):53-65.

Gras et al., Optimizing Bold Sensitivity in the 7T Human Connectome Project-Style Resting-State Functional MRI at 7 Tesla Using Radiofrequency Parallel Transmission, Neuroimage, 2019, 195:1-10.

Grissom et al., Spatial Domain Method for the Design of RF Pulses in Multicoil Parallel Excitation, Magnetic Resonance in Medicine, 2006, 56(3):620-629.

Guerin et al., Local Specific Absorption Rate (SAR), Global SAR, Transmitter Power, and Excitation Accuracy Trade-Offs in Low Flip-Angle Parallel Transmit Pulse Design, Magnetic Resonance in Medicine, 2014, 71(4): 1446-1457.

He et al., Deep Residual Learning for Image Recognition, Proceedings of the IEEE Conference on Computer Vision and Pattern Recognition, 2016, 9 pages.

Hoyos-Idrobo et al., On Variant Strategies to Solve the Magnitude Least Squares Optimization Problem in Parallel Transmission Pulse Design and Under Strict SAR and Power Constraints, arXiv preprint arXiv: 1309.1567, 2013, 11 pages.

Hu et al., Distortion Correction of Single-Shot EPI Enabled by Deep-Learning, Neuroimage, 2020, 221: 117170, 12 pages.

Ianni et al., Machine Leaning RF Shimming: Prediction by Iteratively Projected Ridge Regression, Magnetic Resonance in Medicine, 2018, 80(5): 1871-1881.

Innes, Flux: Elegant Machine Learning with Julia, Journal of Open Source Software, 2018, 3(25):602, p. 1.

Jenkinson et al., FSL, Neuroimage, 2012, 62(2):782-790.

Katscher et al., Transmit Sense, Magnetic Resonance in Medicine, 2003, 49(1): 144-150.

Kingma et al., Adam: A Method for Stochastic Optimization, arXiv Preprint arXiv:1412.6980, 2017, 15 pages.

Knoll et al., Deep Learning Methods for Parallel Magnetic Resonance Image Reconstruction, arXiv preprint arXiv: 1904.01112, 2019, 14 pages.

Lee et al., Deep Artifact Learning for Compressed Sensing and Parallel MRI, arXiv preprint arXiv: 1703.01120, 2017, 32 pages.

Lee et al., Deep Residual Learning for Compressed Sensing Mri, IEEE 14th International Symposium on Biomedical Imaging, 2017, pp. 15-18.

Li et al., Deep Residual Network for Highly Accelerated fMRI Reconstruction Using Variable Density Spiral Trajectory, Neurocomputing, 2020, 398:338-346.

Lim et al., Enhanced Deep Residual Networks for Single Image Super-Resolution, Proceedings of the IEEE Conference on Computer Vision and Pattern Recognition Workshops, 2017, 9 pages.

Lu et al., pISTA-Sense-ResNet for Parallel MRI Reconstruction, Journal of Magnetic Resonance, 2020, 318: 160790, pp. 1-5.

Malik et al., Spatially Resolved Extended Phase Graphs: Modeling and Design of Multipulse Sequences with Parallel Transmission, Magnetic Resonance in Medicine, 2012, 68(5): 1481-1494.

Mao, Parallel Transmission (PTX) Techniques and Applications on a Transceiver Coil Array in High-Field MRI, Dissertation Submitted to the Faculty of Purdue University, 2019, 132 pages.

Massire et al., Parallel-Transmission-Enabled Three-Dimensional T2-Weighted Imaging of the Human Brain at 7 Tesla, Magnetic Resonance in Medicine, 2015, 73(6):2195-2203.

Mazziotta et al., A Probabilistic Atlas and Reference System for the Human Brain: International Consortium for Brain Mapping (ICBM), Philosophical Transactions of the Royal Society of London, Series B: Biological Sciences, 2001, 356(1412): 1293-1322.

Metzger et al., Local B-1(+) Shimming for Prostate Imaging with Transceiver Arrays at 7T Based on Subject-Dependent Transmit Phase Measurements, Magnetic Resonance in Medicine, 2008, 59(2):396-409.

Padormo et al., Parallel Transmission for Ultra High-Field Imaging, NMR in Biomedicine, 2016, 29(9): 1145-1161.

Ronneberger et al., U-Net: Convolutional Networks for Biomedical Image Segmentation, arXiv preprint arXiv: 1505.04597, 2015, 8 pages.

Schmitter et al., Cardiac Imaging at 7 Tesla: Single-and Two-Spoke Radiofrequency Pulse Design with 16-Channel Parallel Excitation, Magnetic Resonance in Medicine, 2013, 70(5): 1210-1219.

Setsompop et al., Magnitude Least Squares Optimization for Parallel Radio Frequency Excitation Design Demonstrated at 7 Tesla with Eight Channels, Magnetic Resonance in Medicine, 2008, 59(4): 908-915.

Setsompop et al., Slice-Selective RF Pulses for In Vivo B(1)(+) Inhomogeneity Mitigation at 7 Tesla Using Parallel RF Excitation with a 16-Element Coil, Magnetic Resonance in Medicine 2008, 60(6): 1422-1432.

Tian et al., DeepDTI: High-Fidelity Six-Direction Diffusion Tensor Imaging Using Deep Learning, Neuroimage, 2020, 219:117017, pp. 1-15.

Tomi-Tricot et al., SmartPulse, A Machine Learning Approach for Calibration-Free Dynamic RF Shimming: Preliminary Study in a Clinical Environment, Magnetic Resonance in Medicine, 2019, 82(6):2016-2031.

Tripathi et al., CNN-DMRI: A Convolutional Neural Network for Denoising of Magnetic Resonance Images, Pattern Recognition Letters, 2020, 135:57-63.

Tse et al., High-Resolution Gradient-Recalled Echo Imaging at 9.4T Using 16-Channel Parallel Transmit Simultaneous Multislice Spokes Excitation with Slice-by-Slice Angle Homogenization, Magnetic Resonance in Medicine, 2017, 78 (3): 1050-1058.

Ugurbil et al., Pushing Spatial and Temporal Resolution for Function and Diffusion MRI in the Human Connectome Project, Neuroimage, 2013, 80:80-104.

(56) References Cited

OTHER PUBLICATIONS

Ugurbil, Imaging at Ultrahigh Magnetic Fields: History, Challenges, and Solutions, Neuroimage, 2018, 168:7-32.

Van De Moortele et al., B(1) Destructive Interferences and Spatial Phase Patterns at 7T with a Head Transceiver Array Coil, Magnetic Resonance in Medicine, 2005, 54(6): 1503-1518.

Van Essen et al., The WU-Minn Human Connectome Project: An Overview, Neuroscience, 2013, 80:62-79.

Vaughan et al., 7T vs. 4T: Rf Power, Homogeneity, and Signal-to-Noise Comparison in Head Images, Magnetic Resonance in Medicine, 2001, 46(1):24-30.

Vu et al., High Resolution Whole Brain Diffusion Imaging at 7T for the Human Connectome Project, Neuroimage, 2015, 122:318-331.

Vu et al., Tradeoffs in Pushing the Spatial Resolution of fMRI for the 7T Human Connectome Project, Neuroimage, 2017, 154:23-32.

Wang et al., Image Quality Assessment: From Error Visibility to Structural Similarity, IEEE Transactions on Image Processing, 2004, 13(4):1-14.

Wu et al., Mitigating Transmit B1 Inhomogeneity in the Liver at 7T Using Multi-Spoke Parallel Transmit RF Pulse Design, Quantitative Imaging in Medicine and Surgery, 2014, 4(1):4-10.

Wu et al., High-Resolution Whole-Brain Diffusion MRI at 7T Using Radiofrequency Parallel Transmission, Magnetic Resonance in Medicine, 2018, 80(5): 1857-1870.

Wu et al., Human Connectome Project-Style Resting-State Functional MRI at 7 Tesla Using Radiofrequency Parallel Transmission, Neuroimage, 2019, 184:396-408.

Xu et al., Designing Multichannel, Multidimensional, Arbitrary Flip Angle RF Pulses Using an Optimal Control Approach, Magnetic Resonance in Medicine, 2008, 59(3):547-560.

Yaman et al., Comparison of Neural Network Architectures for Physics-Driven Deep Learning MRI Reconstruction, IEEE 10th Annual Information Technology, Electronics and Mobile Communication Conference (IEMCON), 2019, 5 pages.

Yan et al., Reconstructing Lost Bold Signal in Individual Participants Using Deep Machine Learning, Nature Communications, 2020, 11(1):5046, pp. 1-13.

Ye et al., Understanding Geometry of Encoder-Decoder CNNs, International Conference on Machine Learning, PMLR, 2019, 10 pages.

Zbontar et al., fastMRI: An Open Dataset and Benchmarks for Accelerated MRI, arXiv preprint arXiv: 1811.08839, 2019, 35 pages.

Zelinski et al., Fast Slice-Selective Radio-Frequency Excitation Pulses for Mitigating B+1 Inhomogeneity in the Human Brain at 7 Tesla, Magnetic Resonance in Medicine, 2008, 59(6):1355-1364.

Zhao et al., Loss functions for Image Restoration with Neural Networks, IEEE Transactions on Computational Imaging, 2016, 3(1):1-11.

Zhu, Parallel Excitation with an Array of Transmit Coils, Magnetic Resonance in Medicine, 2004, 51(4):775-784.

* cited by examiner

PARALLEL TRANSMISSION MAGNETIC RESONANCE IMAGING WITH A SINGLE TRANSMISSION CHANNEL RF COIL USING DEEP LEARNING

CROSS-REFERENCE TO RELATED APPLICATIONS

This application claims priority to U.S. Provisional Application No. 63/182,704, filed Apr. 30, 2021, the entirety of which is incorporated herein by reference.

STATEMENT REGARDING FEDERALLY SPONSORED RESEARCH

This invention was made with government support under EB015894 and EB025144 awarded by the National Institutes of Health. The government has certain rights in the invention.

BACKGROUND

Ultrahigh field ("UHF") magnetic resonance imaging ("MRI") systems (e.g., those operating at a field strength of 7 Tesla and above) offer practical solutions for boosting image signal-to-noise ratio ("SNR") and thereby pushing the limit of image resolution. However, one challenge at UHF is severe transmit B1 (B1+) inhomogeneity encountered when using a conventional single-channel transmit RF coil. The B1+ inhomogeneity, if not corrected, can result in flip angle variations across the brain, which in turn may lead to variations in tissue contrast or even signal dropout, especially in lower brain regions, such as the temporal lobe and cerebellum.

An effective way to address the challenge of B1+ inhomogeneity at UHF is by RF parallel transmission ("pTx"), which is a technique that utilizes a multi-channel RF transmit system and allows channel-specific RF pulse shapes to be applied through individual transmit channels. It has been shown that pTx can substantially improve flip angle uniformity and eliminate signal dropout across the brain when compared with conventional single-channel transmission. In addition, pTx allows for control of RF power deposition in tissues (i.e., specific absorption rate or SAR) by incorporating corresponding power constraints into the formulation of the pTx pulse design problem. To date, the utility of pTx has been demonstrated in a wide range of UHF MRI applications, including high-quality structural brain and body imaging, whole-brain high-resolution BOLD fMRI and dMRI, and so on.

However, the conventional pTx workflow is tedious and relies on special expertise. First, it requires on-the-fly calibration scans to be obtained in each subject under scan to acquire prior knowledge of channel-specific B1+ maps as well as $\Delta B_0$ maps for the subsequent pulse design. Second, it usually involves solving a non-convex optimization problem for pTx pulse waveforms, which can take up to several minutes or even longer especially when designing large tip angle pulses. All these have been a hurdle that prevents pTx from being widely adopted in the UHF community. In addition, using pTx techniques requires specialized and expensive RF hardware, including multi-channel transmitters and multi-channel transmit coils.

SUMMARY OF THE DISCLOSURE

The present disclosure addresses the aforementioned drawbacks by providing a method for generating magnetic resonance images. The method includes accessing single transmission magnetic resonance data with a computer system, where the single transmission magnetic resonance data have been acquired from a subject using a magnetic resonance imaging (MRI) system and a single-channel transmit radio frequency (RF) coil. A trained machine learning model is also accessed with the computer system, where the trained machine learning model has been trained to map magnetic resonance images acquired using single transmission hardware to magnetic resonance images acquired using parallel transmission hardware. The single transmission magnetic resonance data are then input to the trained machine learning model using the computer system, generating output as parallel transmission (pTx)-like magnetic resonance data, where the pTx-like magnetic resonance data have characteristics comparable to magnetic resonance images acquired using parallel transmission hardware.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for generating magnetic resonance images with improved image quality consistent with those obtained using parallel transmission ("pTx") radio frequency ("RF") techniques, from data acquired using single transmission hardware (e.g., single channel RF transmission) and techniques. In general, a deep-learning framework, which may be referred to as "DeepPTx," is used to train a deep neural network to convert images obtained with single transmission into pTx-style images. Advantageously, the DeepPTx techniques described in the present disclosure can significantly enhance magnetic resonance image quality, generally, and improve post-processing analyses, including those used in downstream quantitative analysis.

The DeepPTx techniques described in the present disclosure effectively improve the image quality for sTx images by restoring the signal dropout, while also providing improvement of quality measures (including, e.g., normalized root-mean-square-error, peak signal-to-noise ratio, and structural similarity index measure) in most brain regions. The improved image quality can be translated into improved performances for diffusion tensor imaging analysis, improved accuracy for fractional anisotropy and mean diffusivity estimations, reduced the angular errors of principal eigenvectors, and improved the fiber orientation delineation relative to sTx images, among other improved imaging applications. Accordingly, the DeepPTx techniques described in the present disclosure provide images with reduced B1+ artifacts.

Figure 1:
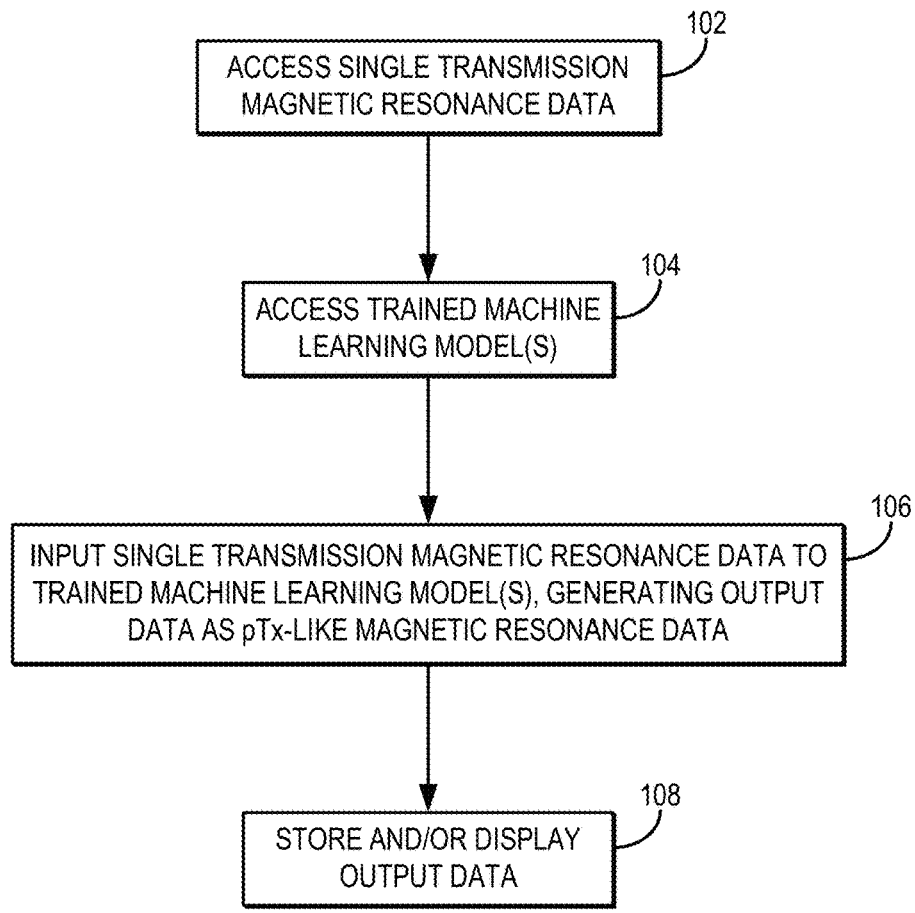
FIG. 1 is a flowchart setting forth the steps of an example method for generating parallel transmission ("pTx")-like magnetic resonance images from data acquired using single transmission hardware.

Referring now to FIG. 1, a flowchart is illustrated as setting forth the steps of an example method for generating magnetic resonance images with image quality comparable to those obtained using parallel transmission techniques using a suitably trained neural network or other machine learning algorithm to generate those images from data acquired using single transmission MRI techniques and/or hardware.

The method includes accessing single transmission magnetic resonance data with a computer system, as indicated at step 102. Accessing the single transmission magnetic resonance data may include retrieving such data from a memory or other suitable data storage device or medium. Alternatively, accessing the single transmission magnetic resonance data may include acquiring such data with an MRI system and transferring or otherwise communicating the data to the computer system, which may be a part of the MRI system. In general, the single transmission magnetic resonance data include magnetic resonance data, or images reconstructed from such data, acquired using single transmission hardware and/or methods. For example, the single transmission magnetic resonance data can include data, or images reconstructed from such data, acquired using a single-channel transmit RF coil.

The single transmission magnetic resonance data can include k-space data or images reconstructed from k-space data. As a non-limiting example, the single transmission magnetic resonance data can include T1-weighted images, T2-weighted images, and/or other magnetic resonance images, such as diffusion-weighted images or perfusion-weighted images. The single transmission magnetic resonance data can also include combinations of such images. For instance, in a diffusion imaging example the single transmission magnetic resonance data can include T1-weighted images in addition to single transmission diffusion images. In one example study, the T1-weighted images were acquired at 0.7-mm isotropic resolutions and were co-registered with the diffusion images. The T1-weighted images were downsampled in this example using a cubic interpolation and were then zero padded to have the same resolution and the same size as the diffusion images. To match the input and output dimensions of the neural network, the input images can also be zero-padded and/or the output images cropped.

A trained neural network, or other suitable machine learning model, is then accessed with the computer system, as indicated at step 104. Accessing the trained neural network may include accessing network parameters (e.g., weights, biases, or both) that have been optimized or otherwise estimated by training the neural network on training data. In some instances, retrieving the neural network can also include retrieving, constructing, or otherwise accessing the particular neural network architecture to be implemented. For instance, data pertaining to the layers in the neural network architecture (e.g., number of layers, type of layers, ordering of layers, connections between layers, hyperparameters for layers) may be retrieved, selected, constructed, or otherwise accessed.

In general, the neural network is trained, or has been trained, on training data in order to learn a mapping between the single transmission magnetic resonance data and data, or images, acquired using parallel transmission hardware and/or techniques. For instance, the neural network can be trained to predict or otherwise generate pTx-style images directly from those obtained using single transmission hardware and/or methods. This may be, for instance, an image-to-image mapping that does not require any pTx software or hardware on the user side.

Figure 2:
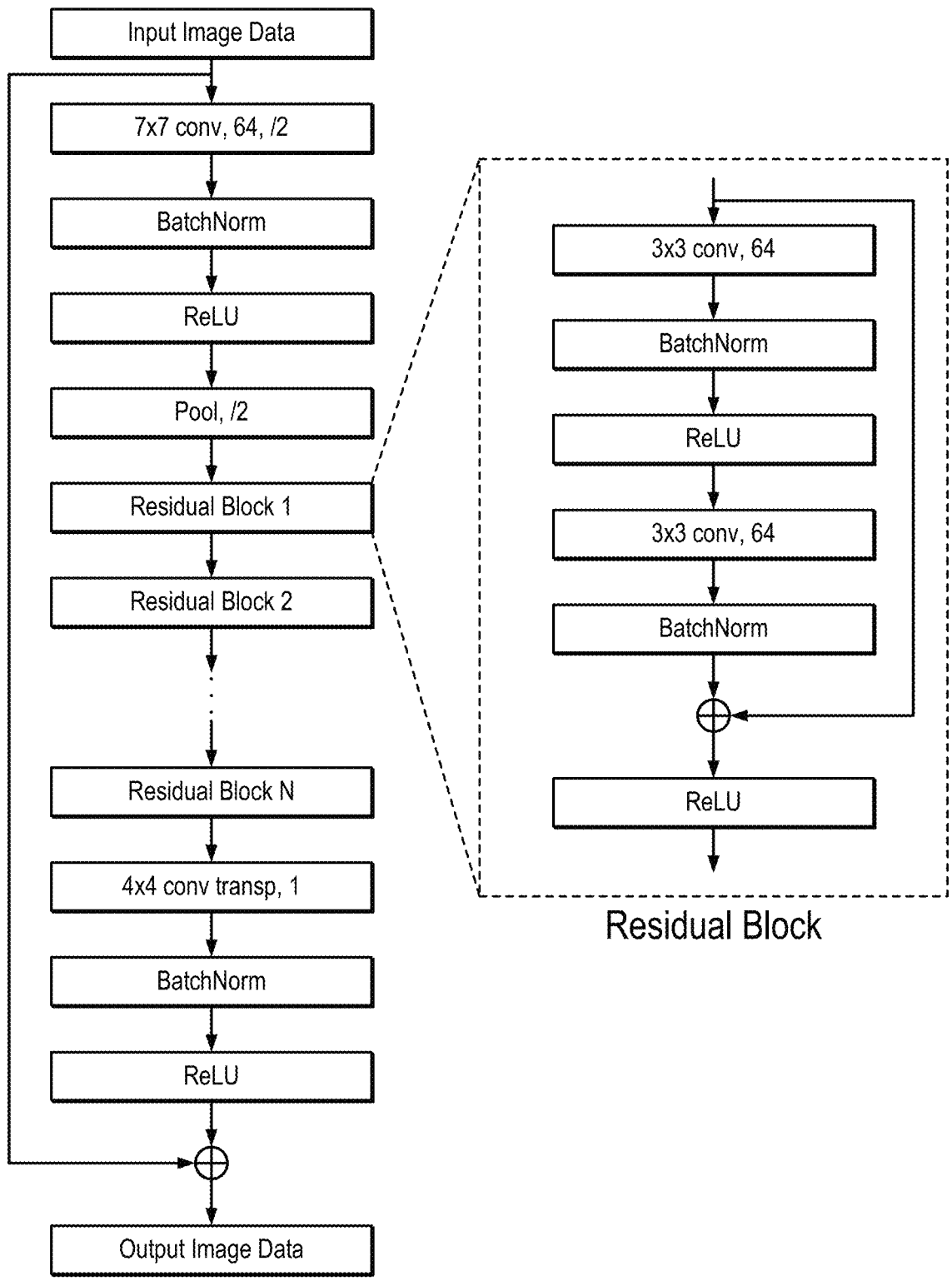
FIG. 2 is an example of a residual neural network architecture that can be implemented to generate pTx-like magnetic resonance images from single transmission data in accordance with some embodiments described in the present disclosure.

As a non-limiting example, the neural network can be a modified deep residual network ("ResNet"), such as the one shown in FIG. 2. Compared with a conventional ResNet structure, the modified ResNet structure shown in FIG. 2 includes several modifications. As one example, the modified ResNet structure includes constant, instead of varying, matrix size (e.g., ¼ of the input) and channel number (e.g., 64) throughout all residual blocks. As another example, the modified ResNet structure includes an additional skip connection between the inputs and outputs for improved prediction performance. As yet another example, the modified ResNet structure includes a transposed convolutional layer for the last layer, instead of a fully-connected layer. The input data (i.e., the single channel magnetic resonance data) can include T1-weighted images.

Figure 3:
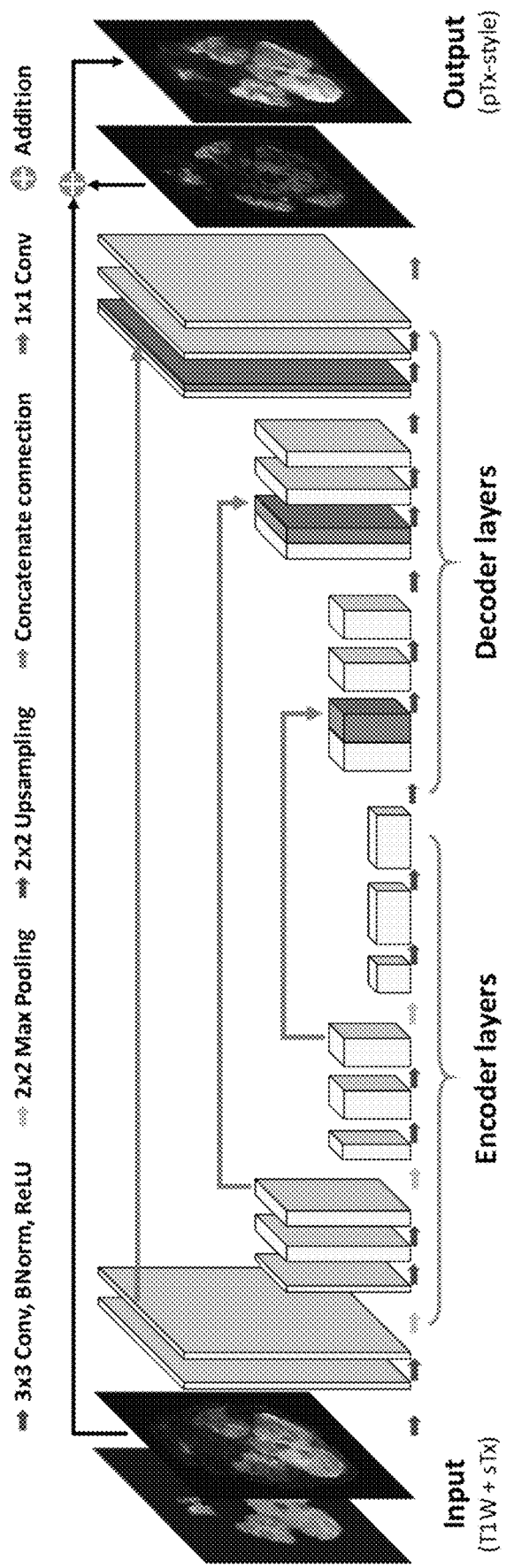
FIG. 3 is an example of an encoder-decoder convolutional neural network that can be implemented to generate pTx-like magnetic resonance images from single transmission data in accordance with some embodiments described in the present disclosure.

As another non-limiting example, the neural network can be an encoder-decoder convolutional neural network ("CNN"), such as the one shown in FIG. 3. The encoder-decoder CNN shown in FIG. 3 contains a same number, N, of encoder levels and decoder levels. Each encoder level contained a 2×2 downsampling layer (via max pooling) and two repetitions of 3×3 convolution, batch-normalization, and ReLU activation (3×3 Conv-BN-ReLU) operations; each decoder level contained a 2×2 upsampling layer and two repetitions of 3×3 Conv-BN-ReLU operations. The number of output channels was doubled after each downsampling layer, and was halved after each upsampling layer. Further, skip connections were added with concatenation operations between corresponding encoder and decoder levels to reduce resolution loss, and a global addition connection was appended to improve the training performance by enabling residual learning.

The depth of the encoder-decoder CNN is determined by the number of encoder and decoder levels (i.e., N), and the width is determined by the number of output channels for the first layer. These are two parameters, then, that can control the model capacity and influence over-fitting. In some instances, the number of encoder and decoder levels and the width can be considered as hyperparameters and can be tuned during the model selection process.

The single transmission magnetic resonance data are then input to the trained neural network, generating output data as pTx-like magnetic resonance data, as indicated at step 106. For example, the pTx-like magnetic resonance data may include magnetic resonance images having image quality and characteristics that are comparable to those acquired using parallel transmission hardware and techniques.

The pTx-like magnetic resonance data generated by inputting the single transmission magnetic resonance data to the trained neural network(s) can then be displayed to a user, stored for later use or further processing, or both, as indicated at step 108.

Figure 4:
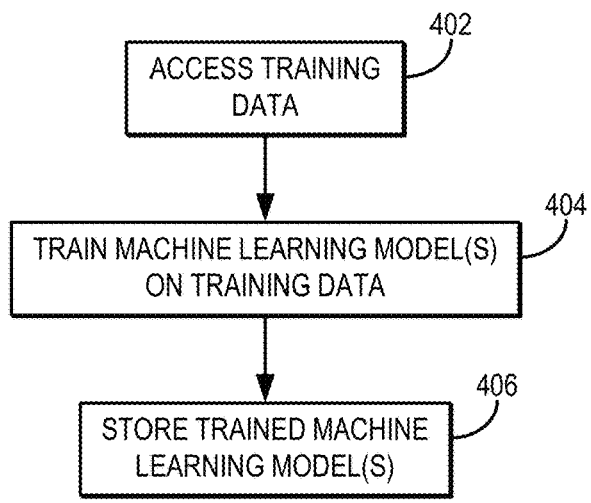
FIG. 4 is a flowchart setting forth the steps of an example method for training a machine learning model to learn a mapping from single transmission magnetic resonance images to parallel transmission magnetic resonance images.

Referring now to FIG. 4, a flowchart is illustrated as setting forth the steps of an example method for training one or more neural networks, or other suitable machine learning models, on training data, such that the one or more neural networks are trained to receive input as single transmission magnetic resonance data in order to generate output as pTx-like magnetic resonance data.

In general, the neural network(s) can implement any number of different neural network architectures. For instance, the neural network(s) could implement a convolutional neural network ("CNN"), a residual neural network, an encoder-decoder CNN, and so on. In some instances, the neural network(s) may implement deep learning. Additionally or alternatively, instead of using a neural network other machine learning models can be used. For example, a generative adversarial network ("GAN") could be trained and implemented. In still other examples, deep learning models other than neural networks or GANs could also be trained and implemented.

The method includes accessing training data with a computer system, as indicated at step 402. Accessing the training data may include retrieving such data from a memory or other suitable data storage device or medium. Alternatively, accessing the training data may include acquiring such data with an MRI system that includes parallel transmission hardware and transferring or otherwise communicating the data to the computer system, which may be a part of the MRI system.

In general, the training data can include pTx magnetic resonance data acquired using parallel transmission hardware and/or techniques, and single transmission magnetic resonance data acquired using single transmission hardware and/or techniques. As a non-limiting example, the training data can include a pair of matched, 1.05-mm Human-Connectome-Project (HCP)-style dMRI datasets: one obtained with sTx using the commercial Nova single-channel transmit 32-channel receive (1Tx32Rx) coil and the other with pTx using the commercial Nova 8Tx32Rx coil. Both sTx and pTx dMRI datasets in this example included 36 preprocessed image volumes (including 32 diffusion-weighted images with b-value of 1000 s/mm2 and 4 b=0 images), with each image volume having 100 slices covering the whole brain. As a result, the training dataset included a total of 18,000 samples (5 subjects×100 slices×36 volumes), each sample being a pair of corresponding sTx and pTx image slices.

One or more neural networks, or other suitable machine learning models, are trained on the training data, as indicated at step 404. In general, the neural network, or other machine learning model, can be trained by optimizing network or model parameters (e.g., weights, biases, or both) based on minimizing a loss function. As one non-limiting example, the loss function may be a mean squared error loss function.

Training a neural network may include initializing the neural network, such as by computing, estimating, or otherwise selecting initial network parameters (e.g., weights, biases, or both). Training data can then be input to the initialized neural network, generating output as pTx-like magnetic resonance data. The quality of the pTx-like magnetic resonance data can then be evaluated, such as by passing the pTx-like magnetic resonance data to the loss function to compute an error. The current neural network can then be updated based on the calculated error (e.g., using backpropagation methods based on the calculated error). For instance, the current neural network can be updated by updating the network parameters (e.g., weights, biases, or both) in order to minimize the loss according to the loss function. When the error has been minimized (e.g., by determining whether an error threshold or other stopping criterion has been satisfied), the current neural network and its associated network parameters represent the trained neural network.

As an example, the loss function can be formulated to measure the mean squared error ("MSE") between the output data and the pTx magnetic resonance data in the training dataset. For improved training performance, decaying learning rates can be used, with the learning rate at the $i^{th}$ epoch ($LR_i$) being calculated as:

$$LR_i = LR_0 \cdot e^{-DF \cdot floor\left(\frac{i-1}{DS}\right)}; \qquad (1)$$

where $LR_0$ is the initial learning rate, DF is the learning rate decay factor, and DS is the learning rate decay step.

Hyperparameter tuning can be carried out using a random search where a selected number of points in the hyperparameter space are randomly sampled. The hyperparameter set providing the best prediction performance can then be selected to form the final model.

In model evaluation, the generalizability of the final model can be estimated using cross-validation ("CV"). As one non-limiting example, a regular 5-fold CV, with the dataset split into 4:1 for training/testing where each fold includes data of a single subject, can be used when having data on five subjects. In model selection, relevant hyperparameters of the neural network, or other machine learning model, can be optimized using a nested CV. As a non-limiting example, a nested 5-fold CV (with dataset split into 3:1:1 for training/validation/testing and each fold including data of a single subject) can be performed to tune relevant hyperparameters when having data on five subjects.

When using an encoder-decoder CNN, as described above, the following six hyperparameters can be considered: the number of encoder or decoder levels (i.e., N), the number of output channels for the first layer, the mini-batch size, the initial learning rate, the learning rate decay factor, and the learning rate decay step. The hyperparameter tuning can be carried out using a random search, in which the optimal hyperparameter set is chosen from a pool of candidate hyperparameter sets created by randomly sampling the hyperparameter space (spanned by the six hyperparameters under consideration).

Figure 5:
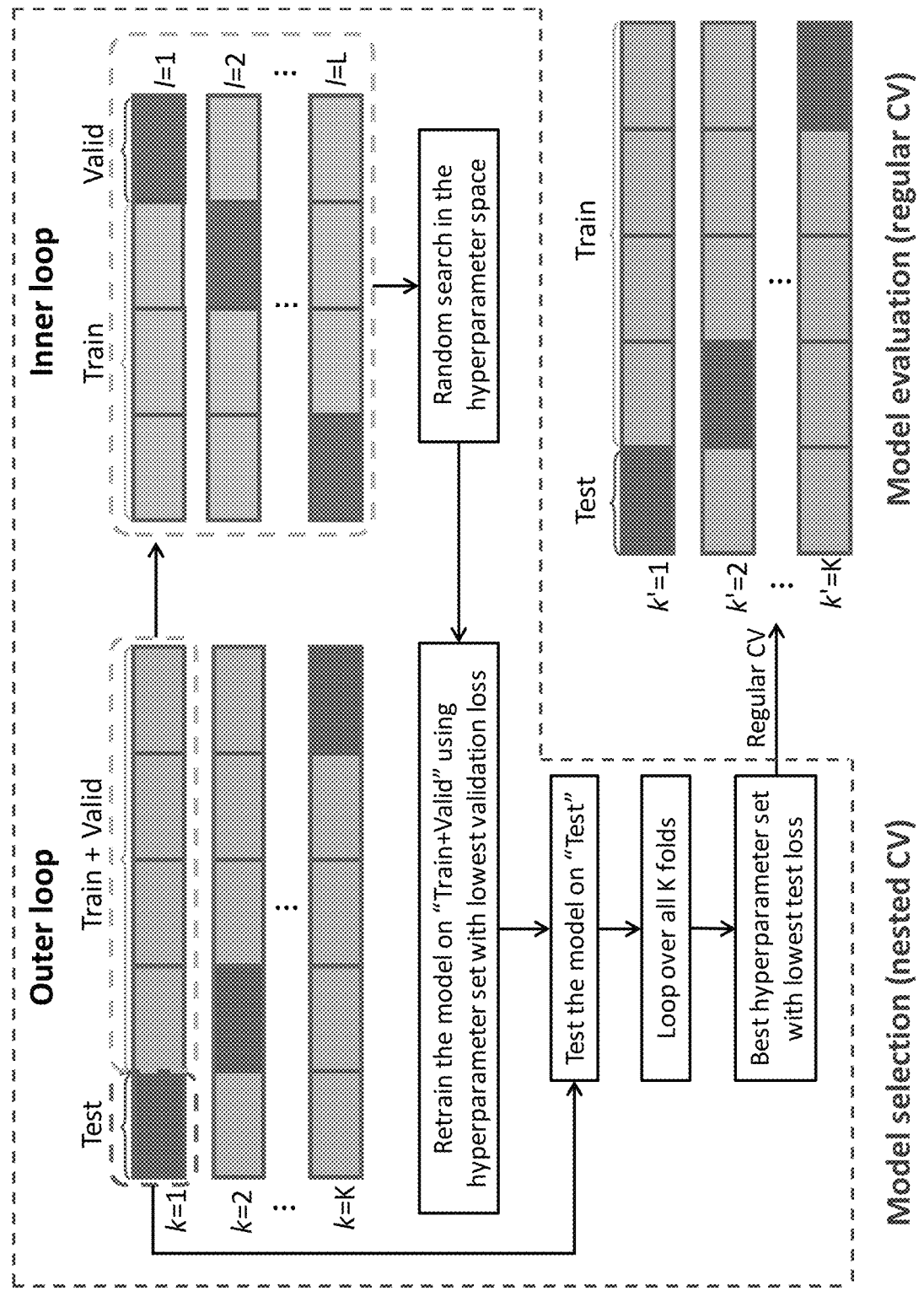
FIG. 5 illustrates an example cross-validation technique that can be implemented in accordance with some embodiments described in the present disclosure.

Referring to FIG. 5, an example nested 5-fold CV includes an inner loop nested inside an outer loop. Specifically, the outer loop has five iterations, each involving an associated inner loop, leading to five such associated inner loops. Each associated inner loop has four repetitions. In every repetition, all candidate hyperparameter sets are used to form the DeepPTx model; for all the candidate hyperparameter sets, the model is trained on training data and validated on validation data. Upon the completion of the inner loop, the average validation loss across all four repetitions is evaluated for all the candidate hyperparameter sets and the hyperparameter set with the lowest average validation loss is chosen as the iteration-specific tuned hyperparameter set. In every iteration of the outer loop, the iteration-specific tuned hyperparameter set obtained from the associated inner loop is used to form the model; the model is trained on both training and validation data and tested on testing data. Upon the completion of the outer loop, the iteration-specific hyperparameter set with the lowest test loss (i.e., the best prediction performance) is selected as the optimal hyperparameter set.

In model evaluation, a regular 5-fold CV (with dataset split into 4/1 for training/testing and each fold comprising data of a single subject) can be conducted to estimate the generalization performance of the model with the optimal hyperparameter set. The regular 5-fold CV involves five iterations. In each iteration, the model is trained on the training data and tested on the testing data. The test loss averaged across all five iterations is calculated and used to evaluate the generalization performance.

In both model selection and evaluation, each training involved in the nested and the regular CV can utilize a stop strategy for improved training performance. As an example, an early-stop strategy can be implemented to reduce overfitting, in which each training is conducted as follows: the model is trained using a total of 30 epochs; after every epoch (greater than 10) the trained model as well as the associated validation or test loss are recorded; from the 20 candidate epoch-specific trained models, the one with the lowest validation or test loss is selected as the final trained model.

In some implementations, the quality of the predicted images (e.g., predicted diffusion images) can be evaluated by examining how close the predicted images would be to corresponding pTx acquisitions in various brain regions. As one example, this can be done by using image results from the regular 5-fold CV. Specifically, for each subject, the diffusion images predicted by the model with the best hyperparameter set (when trained on the other four subjects) can be used to calculate region-specific metrics for image quality assessment, including normalized root-mean-square-error ("nRMSE"), peak signal-to-noise-ratio ("PSNR"), structural similarity index measure ("SSIM"), and point spread function ("PSF"), all in reference to pTx acquisitions. In each case in this example, a total of 10 brain regions-of-interest ("ROIs") were considered, including 9 anatomic regions defined by the MNI structural atlas plus the whole brain. The whole-brain ROI can be defined as the brain mask calculated from the reference pTx images, where cerebrospinal fluid ("CSF") signals can be excluded. For comparison, region-specific nRMSE, PSNR, SSIM values and PSF were also calculated in this example using the sTx diffusion images. As one example, for each region-specific quality measure, a paired t-test was used to determine whether there would be a difference between sTx and the deep learning model.

A diffusion analysis may be performed to investigate how the deep learning model would improve diffusion tensor imaging ("DTI") in comparison to sTx acquisitions. In an example study, the image results of the regular 5-fold CV were used. Specifically, for each subject, the diffusion images predicted by the model with the optimal hyperparameter set (when trained on the other four subjects) were used to fit the DTI model using FSL's dtifit routine to derive fractional anisotropy ("FA"), mean diffusivity ("MD"), and fiber orientation vectors (i.e., the principal eigenvectors). For both FA and MD, region-specific nRMSE, PSNR, SSIM, and PSF were calculated to measure the deviation from or similarity to the reference metric as obtained by fitting the DTI model to the pTx acquisitions. For fiber orientation vectors, region-specific angular errors of the principal eigenvectors were evaluated to quantify the angular difference from the reference principal eigenvectors derived from the pTx acquisitions. All region-specific quality measures for FA and MD maps and the region-specific angular errors of the principal eigenvectors were calculated for the same 10 brain ROIs as in the aforementioned evaluation of image quality. For comparison, region-specific quality measures for FA and MD maps as well as the region-specific angular errors of the principal eigenvectors (all in reference to the pTx acquisitions) were also calculated based on the diffusion metrics derived by fitting the DTI model to the sTx diffusion images, and paired t-tests were conducted.

With respect to calculating of region-specific quality metrics, for each region, the region-specific nRMSE and region-specific PSNR values can be calculated as follows:

$$nRMSE = \frac{1}{\text{mean }(x_0)}\sqrt{\frac{1}{MV}\sum_{i=1}^{M}\sum_{j=1}^{V}(x(i,j) - x_0(i,j))^2} ; \quad (2)$$

$$PSNR = 10 \cdot \log_{10}\frac{1}{\frac{1}{MV}\sum_{i=1}^{M}\sum_{j=1}^{V}(x(i,j) - x_0(i,j))^2} ; \quad (3)$$

where M is the number of voxels inside the ROI under consideration, V is the number of image volumes in the diffusion timeseries (i.e., V=36 in this case), $x(i,j)$ and $x_0(i,j)$ denote the image intensity at the i-th voxel inside the ROI of the j-th image volume for the predicted and the pTx acquired diffusion images, respectively, and mean ($x_0$) represents the mean image intensity inside the ROI of the pTx acquired diffusion timeseries.

The region-specific SSIM can be evaluated by:

$$SSIM = \frac{1}{V}\sum_{j=1}^{V}\frac{\left(2\mu_x(j)\mu_{x_0}(j) + C_1\right)\left(2\sigma_{xx_0}(j) + C_2\right)}{1\left(\mu_x^2(j) + \mu_{x_0}^2(j) + C_1\right)\left(\sigma_x^2(j) + \sigma_{x_0}^2(j) + C_2\right)}; \quad (4)$$

where $\mu_x(j)$ and $\sigma_x(j)$ denote respectively the mean and standard deviation inside the ROI of the j-th predicted image volume; $\mu_{x_0}(j)$ and $\sigma_{x_0}(j)$ denote respectively the mean and standard deviation inside the ROI of the j-th pTx acquired image volume; $\sigma_{xx_0}(j)$ is the cross-covariance inside the ROI between the j-th predicted and the j-th pTx acquired image volumes; $C_1$ and $C_2$ are two regularization factors used to avoid instability for image regions where the local mean or standard deviation is close to zero.

The region-specific PSF was calculated by:

$$PSF = \frac{1}{SV}\sum_{s=1}^{S}\sum_{j=1}^{V} iFT\left(\frac{FT(x(s,j))}{FT(x_0(s,j))}\right); \quad (5)$$

where S is the number of slices inside the ROI under consideration, V is the number of image volumes, FT and iFT denote the forward and inverse Fourier transforms, respectively; $x(s,j)$ and $x_0(s,j)$ denote the s-th image slice of the j-th image volume for the predicted and the pTx acquired diffusion images, respectively, with the voxel intensity nulled outside the ROI. The PSF can be used to quantify the blurring of the predicted images by measuring its full-width-at-half-maximum ("FWHM") in both right-left (RL) and anterior-posterior (AP) directions.

In diffusion analysis, for both FA and MD, region-specific nRMSE, PSNR, SSIM, and PSF can also be calculated using Equations 2-5, except that V=1 was used while x and $x_0$ can be the diffusion metric values inside the ROI derived from the predicted diffusion images and from the pTx acquisitions, respectively.

The one or more trained neural networks, or other machine learning models, are then stored for later use, as indicated at step 406. Storing the neural network(s) may include storing network or model parameters (e.g., weights, biases, or both), which have been computed or otherwise estimated by training the neural network(s) on the training data. Storing the trained neural network(s), or other machine learning model(s), may also include storing the particular neural network or model architecture to be implemented. For instance, data pertaining to the layers in the neural network architecture (e.g., number of layers, type of layers, ordering of layers, connections between layers, hyperparameters for layers) may be stored.

As noted above, a GAN could be trained and implemented. In some implementations, a deep learning model may be developed using GANs for anatomic T1-weighted and T2-weighted MRI, and for diffusion MRI, such that UHF MRI for studying whole-brain anatomy, function, and connectivity is enhanced.

Accordingly, in some implementations deep neural networks may be developed that can improve image quality for high-resolution whole-brain anatomic T1-weighted and T2-weighted MRI and diffusion MRI when obtained with sTx. The combined use of UHF of 7T and the model(s) disclosed herein can increase the ability to delineate brain anatomy, microstructure, and connectivity, which can provide improved imaging results that can aid a clinician in determining a diagnosis. As described above, the systems and methods described in the present disclosure can achieve these benefits by developing and optimizing deep neural networks for predicting parallel-transmission-style anatomic T1-weighted and T2-weighted MRI and diffusion MRI from data acquisitions with single-channel transmission at 7T. For example, 3D T1-weighted MPRAGE, 3D T2-weighted turbo spin-echo and HCP-style diffusion images can be acquired. For each contrast, a training dataset can be built by acquiring whole-brain images in 40 healthy human subjects using both sTx and pTx methods. A deep convolutional neural network can be developed and optimized that can predict pTx images based on images obtained with sTx. In implementations where a GAN is utilized, the neural network can be trained using the conditional generative adversarial networks framework and can perform model selection and evaluation using cross validation. The neural network can be implemented to have the ability to quantify the uncertainty of its prediction.

The deep neural networks disclosed herein can improve image quality and downstream image analysis in comparison to single-channel transmission. For example, the deep learning methods disclosed herein can improve the image quality for anatomic T1-weighted and T2-weighted MRI in addition to diffusion MRI at 7T when obtained using a commercial single-channel transmit RF coil. Additionally, the deep learning methods can improve other imaging applications (e.g., functional MRI) at UHF. Further, the deep learning framework can promote clinical translation of 7T MRI and increase the general utility of UHF MRI for studies of the human brain in health and disease.

Figure 6:
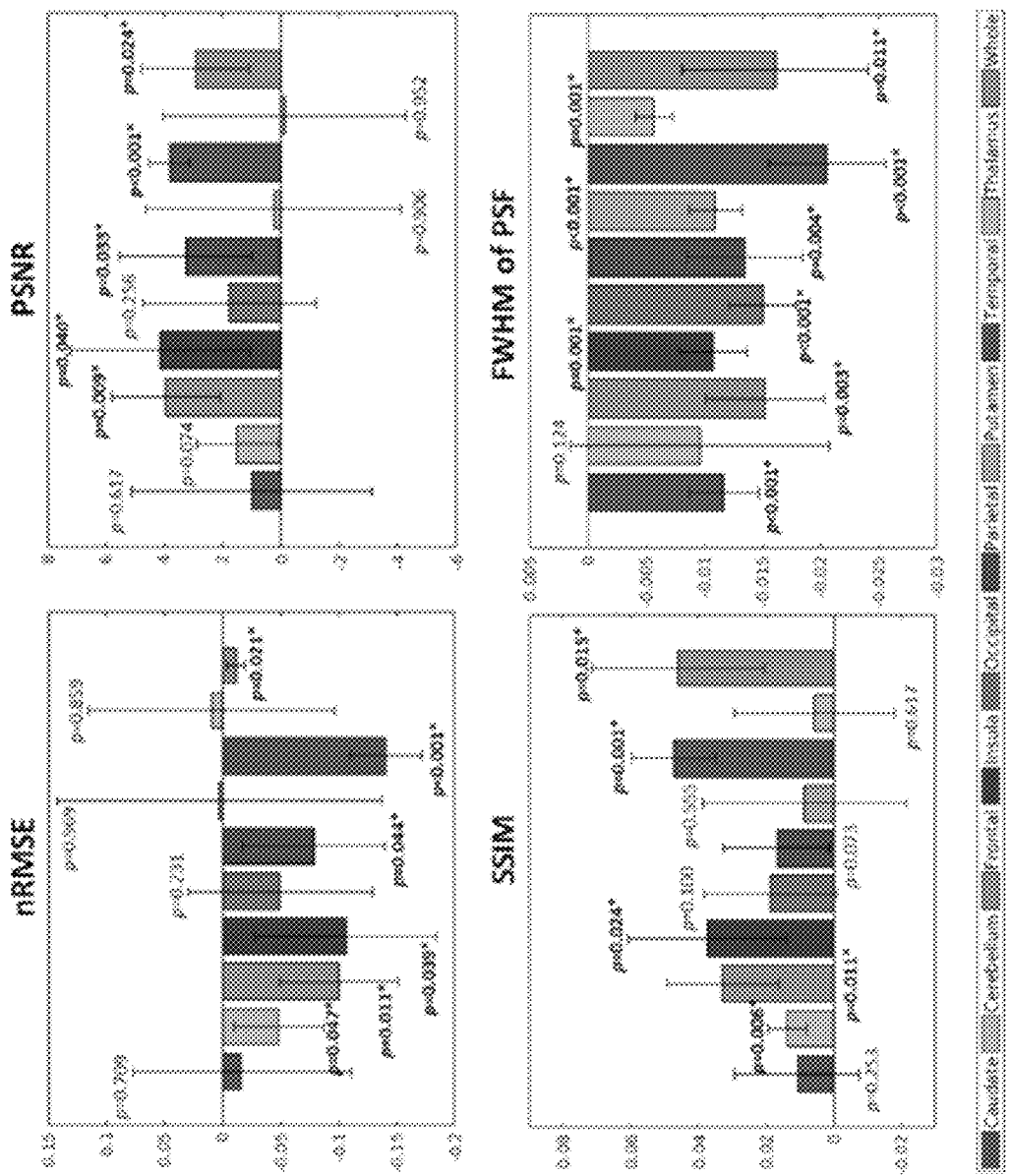
FIG. 6 is a set of graphs comparing single transmission and a deep neural network in terms of image quality in accordance with some embodiments described in the present disclosure.

As one example, FIG. 6 is a set of graphs comparing single transmission and a deep neural network in terms of image quality in accordance with some embodiments described in the present disclosure. In each case, image quality was evaluated using four quality measures: nRMSE, PSNR, SSIM, and FWHM of PSF, all in reference to the acquisition with parallel transmission. With respect to FIG. 6, shown are mean and standard deviation (across five subjects) of the differences in region-specific nRMSE, PSNR, SSIM, and FWHM of PSF between sTx and our DL method (with the difference being the quality measure of the deep learning method minus that of sTx). For both sTx and the deep learning method, region-specific values of each quality measure were evaluated by considering a total of 10 brain regions of interest (including nine brain regions as defined by the MNI152 standard-space structural atlas plus the whole brain). The numbers reported are the p values obtained from a paired t-test, with significance being denoted by "*". As illustrated in FIG. 6, the use of the deep learning method described herein significantly decreased nRMSE values and FWHM of PSF, while increasing both PSNR and SSIM values in most brain regions including the whole brain.

The use of the deep learning method appeared to substantially improve the image quality for both b=0 and b=1000 acquisitions when compared with sTx, effectively restoring the signal dropout as observed in the lower brain region such as the temporal pole. The anatomic structure and image contrast of the restored signals were comparable with the reference pTx acquisitions, despite that slight image blurring was observed (e.g., in the cerebellum). Similar results were observed when inspecting the diffusion-weighted images for each individual subject.

With reference to FIG. 6, further quantitative analyses on quality measures revealed that the use of the deep learning method decreased both region-specific nRMSE values and mean FWHM of PSF (averaged across both right-left and anterior-posterior directions) while increasing both region-specific PSNR and SSIM values in most brain regions relative to sTx acquisitions, with the improvement being significant for all quality measures when considering the following ROIs: whole brain, frontal lobe, temporal lobe and insula. Quantitatively, the percentage changes of whole-brain nRMSE, PSNR, SSIM and FWHM values (calculated as |val_DL−val_sTx|/val_sTx*100%, where val_DL is the quality measure of the deep learning method and val_sTx the quality measure of sTx, and "| |" denotes the absolute value) were 28%, 9%, 5% and 0.8%, respectively. For the other three ROIs with a significant improvement in all quality measures, the percentage changes of nRMSE, PSNR, SSIM, and FWHM values ranged from 35% (temporal lobe) to 37% (insula), from 11% (frontal lobe) to 12% (temporal lobe), from 5% (insula) to 10% (temporal lobe), and from 0.6% (Insula) to 1% (temporal lobe), respectively.

Figure 7:
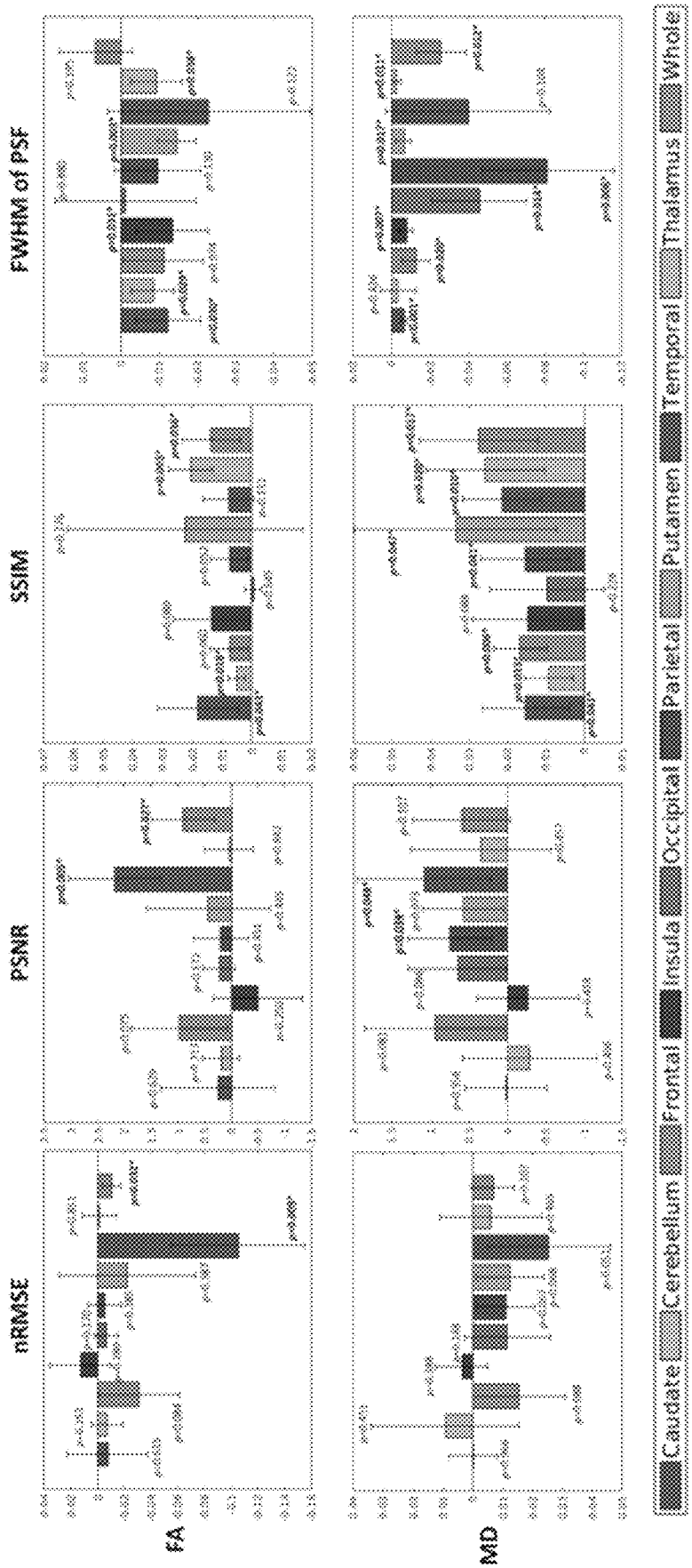
FIG. 7 is a set of graphs comparing single transmission and a deep neural network in terms of quality of diffusion tensor imaging metrics in accordance with some embodiments described in the present disclosure.

As another example, FIG. 7 is a set of graphs comparing single transmission and a deep neural network in terms of quality of diffusion tensor imaging metrics, including FA and MD, in accordance with some embodiments described in the present disclosure. The quality of each metric was evaluated using four quality measures: nRMSE, PSNR, SSIM, and FWHM of PSF, all in reference to the acquisition with parallel transmission. For each metric, shown are mean and standard deviation (across five subjects) of the differences in region-specific nRMSE, PSNR, SSIM and FWHM of PSF between sTx and the deep learning method (with the difference being the quality measure of the deep learning method minus that of sTx). For all cases, the region-specific values of each quality measure were evaluated by considering a total of 10 brain regions of interest (including nine brain regions as defined by the MNI152 standard-space structural atlas plus the whole brain). The numbers reported are the p values obtained from a paired t-test, with significance being denoted by "*". For both FA and MD, the deep learning method decreased nRMSE and FWHM of PSF, while increasing PSNR and SSIM in most brain regions, as illustrated in FIG. 7.

Accordingly, the use of the deep learning method improved diffusion tensor imaging performances by substantially decreasing the fitting error, leading to increased quality and accuracy for both FA and MD estimations especially in the lower temporal lobe when compared to the sTx acquisition. The sum-of-squared fitting error ("SSE") averaged across the whole brain decreased by as high as 68% (0.17 for the deep learning method vs. 0.53 for sTx acquisition) and appeared even lower than that of the reference pTx acquisition (0.17 for the DL method vs. 0.40 for pTx acquisition).

Further quantitative analyses on quality measures showed that overall the results were in agreement with those of image quality evaluation, as illustrated in FIG. 7. For both FA and MD, use of the deep learning method decreased both region-specific nRMSE values and mean FWHM of PSF while increasing both region-specific PSNR and SSIM values in most brain regions relative to sTx acquisitions.

For FA, the use of the deep learning method led to a significant improvement in all quality measures except for FWHM when considering the whole-brain ROI. The percentage changes of whole-brain nRMSE, PSNR, SSIM, and FWHM values were 10%, 5%, 2%, and 0.3%, respectively. The use of the deep learning method also significantly decreased nRMSE and significantly increased PSNR in the temporal lobe, with the percentage changes of nRMSE and PSNR being 23% and 14%, respectively. It also significantly increased SSIM and significantly decreased FWHM in three brain ROIs including caudate, cerebellum, and thalamus, with the percentage change of SSIM and FWHM ranging from 2% (cerebellum) to 5% (thalamus), and from 0.4% (cerebellum) to 0.7% (caudate), respectively.

For MD, although decreasing the nRMSE value for most brain regions (7 out of 10 ROIs), the use of the deep learning method did not bring a significant improvement to this quality measure in any brain ROI. For those ROIs with an improvement, the percentage change of nRMSE ranged from 3% (insula) to 12% (temporal lobe). The use of the deep learning method also increased PSNR in all brain ROIs except for cerebellum and insula. For those eight ROIs with an improvement, the improvement was however found significant only in the parietal and temporal lobes, with the percentage change being 1% in both. However, the use of the deep learning method increased SSIM and decreased mean FWHM of PSF in all brain ROIs, with the improvement being significant in most brain ROIs including the whole-brain ROI. For the ROIs with a significant improvement, the percentage change of SSIM and FWHM ranged from 2% (cerebellum) to 6% (temporal lobe), and from 0.2% (thalamus) to 2.3% (occipital lobe), respectively. For the whole-brain ROI, the percentage changes of nRMSE, PSNR, SSIM, and FWHM were 7%, 1%, 4%, and 1.2%, respectively.

Figure 8:
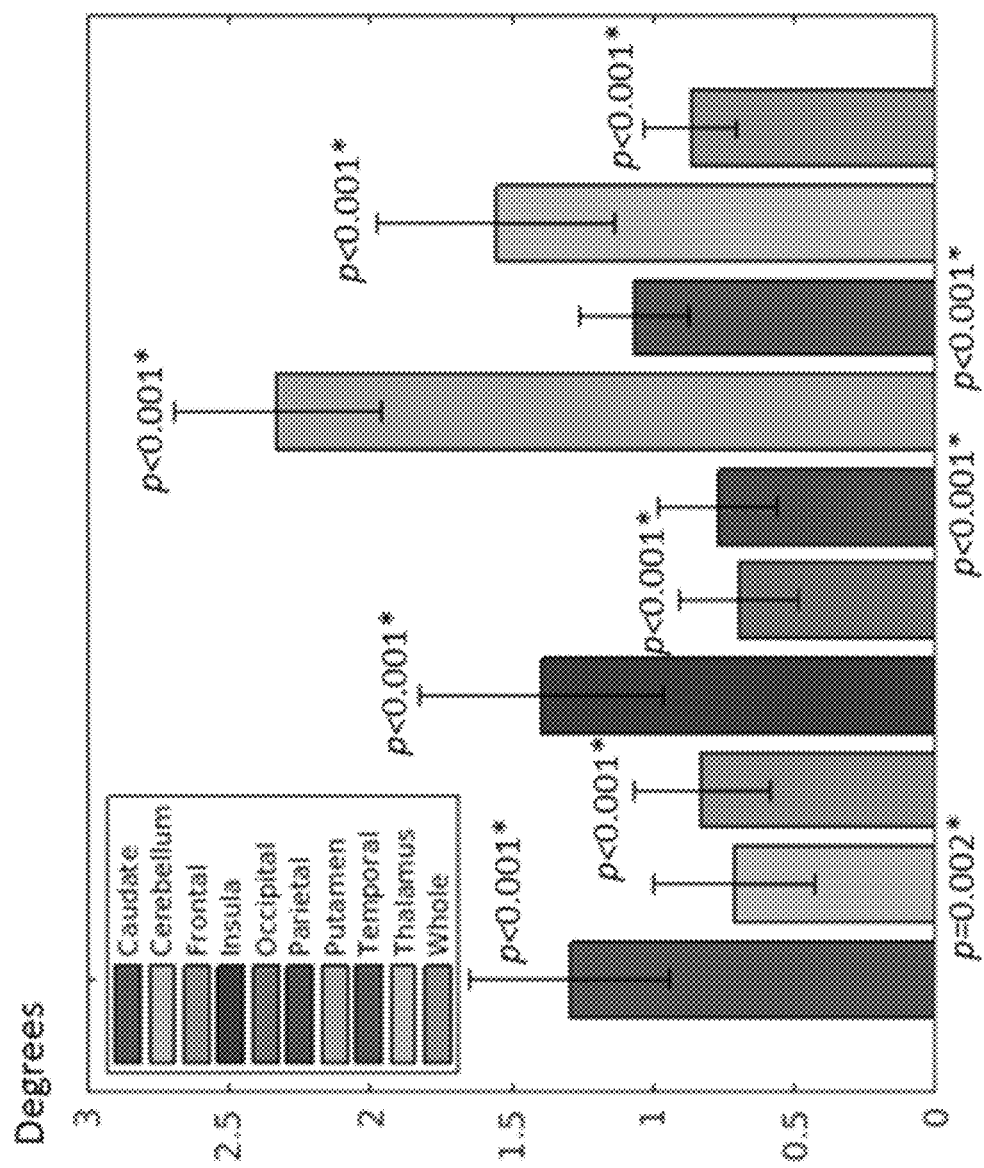
FIG. 8 is a graph comparing single transmission and a deep neural network in terms of angular errors of principal eigenvector estimations in accordance with some embodiments described in the present disclosure.

As yet another example, FIG. 8 is a graph comparing single transmission and a deep neural network in terms of angular errors of principal eigenvector estimations in accordance with some embodiments described in the present disclosure. FIG. 8 illustrates mean and standard deviation (across five subjects) of the differences in angular errors between sTx and the deep learning method (with the difference being the angular error of sTx minus that of the deep learning method). For both sTx and the deep learning method, region-specific angular errors were evaluated in reference to the acquisition with parallel transmission and by considering a total of 10 brain regions of interest (including nine brain regions as defined by the MNI152 standard-space structural atlas plus the whole brain). The numbers reported are the p values obtained from a paired t-test, with significance being denoted by "*".

As illustrated in FIG. 8, the use of the deep learning method substantially improved the performances for principal eigenvector estimations, significantly decreasing the angular errors across all the selected brain regions. Accordingly, the deep learning method improved the performances for the principal eigenvector estimation relative to sTx acquisition, producing better delineated fiber orientations that more closely resembled what was attainable with the pTx acquisition. This improvement was further verified by quantitative comparison of angular errors in reference to pTx acquisition. As illustrated in FIG. 8, the angular errors were significantly lower for the deep learning method than for sTx acquisition across all brain ROIs. The percentage change of angular errors ranged from 4% (occipital lobe) to 9% (caudate and thalamus), with its value being 6% for the whole-brain ROI.

Figure 9:
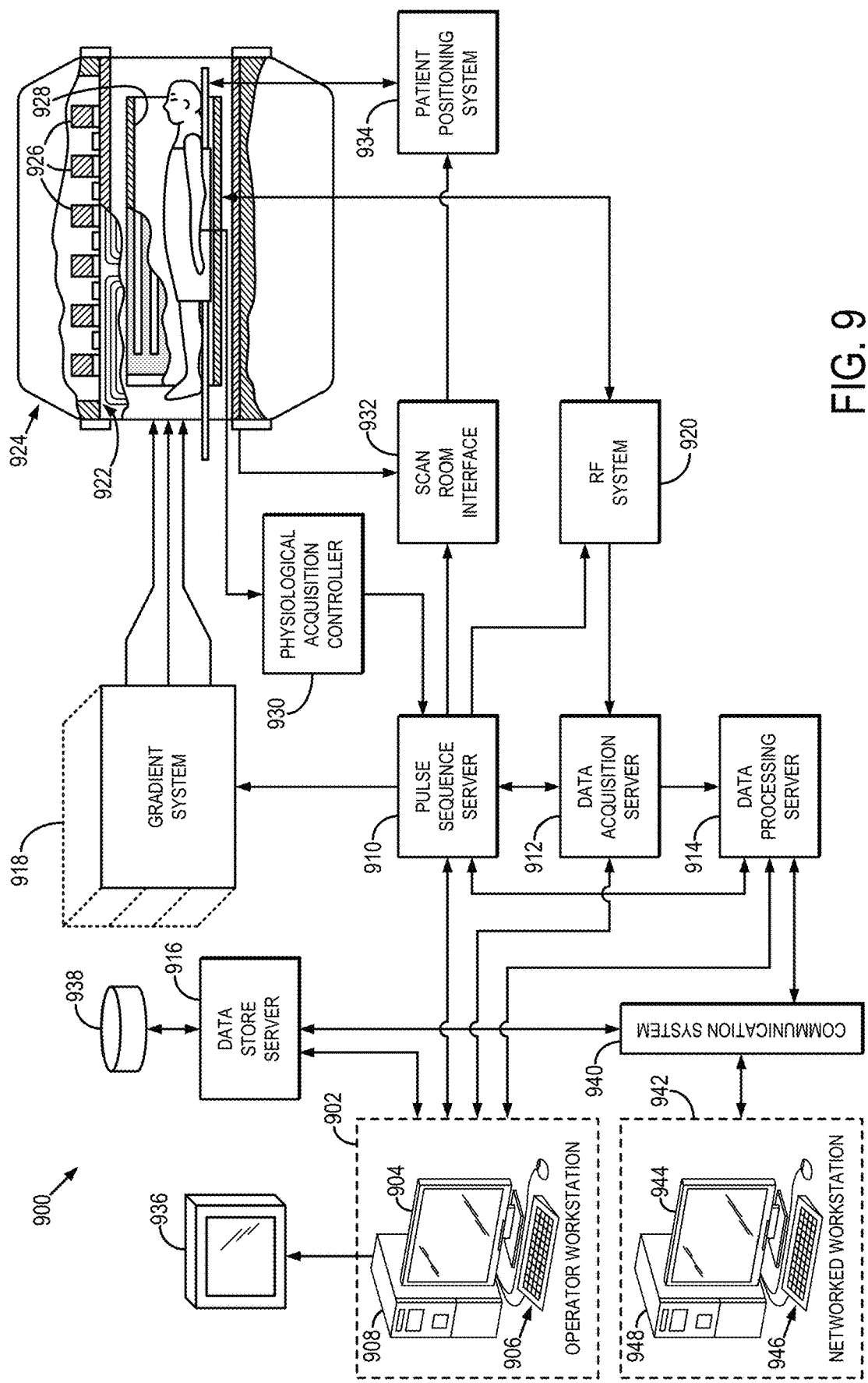
FIG. 9 is a block diagram of an example magnetic resonance imaging ("MRI") system that can be configured to acquire single transmission data for implementing the methods described in the present disclosure, and/or to acquire parallel transmission data for training machine learning models in accordance with some embodiments described in the present disclosure.

Referring particularly now to FIG. 9, an example of a magnetic resonance imaging ("MRI") system 900 that can implement the methods described here is illustrated. The MRI system 900 includes an operator workstation 902 that may include a display 904, one or more input devices 906 (e.g., a keyboard, a mouse), and a processor 908. The processor 908 may include a commercially available programmable machine running a commercially available operating system. The operator workstation 902 provides an operator interface that facilitates entering scan parameters into the MRI system 900. The operator workstation 902 may be coupled to different servers, including, for example, a pulse sequence server 910, a data acquisition server 912, a data processing server 914, and a data store server 916. The operator workstation 902 and the servers 910, 912, 914, and 916 may be connected via a communication system 940, which may include wired or wireless network connections.

The pulse sequence server 910 functions in response to instructions provided by the operator workstation 902 to operate a gradient system 918 and a radiofrequency ("RF") system 920. Gradient waveforms for performing a prescribed scan are produced and applied to the gradient system 918, which then excites gradient coils in an assembly 922 to produce the magnetic field gradients $G_x$, $G_y$, and $G_z$ that are used for spatially encoding magnetic resonance signals. The gradient coil assembly 922 forms part of a magnet assembly 924 that includes a polarizing magnet 926 and a whole-body RF coil 928.

RF waveforms are applied by the RF system 920 to the RF coil 928, or a separate local coil to perform the prescribed magnetic resonance pulse sequence. Responsive magnetic resonance signals detected by the RF coil 928, or a separate local coil, are received by the RF system 920. The responsive magnetic resonance signals may be amplified, demodulated, filtered, and digitized under direction of commands produced by the pulse sequence server 910. The RF system 920 includes an RF transmitter for producing a wide variety of RF pulses used in MRI pulse sequences. The RF transmitter is responsive to the prescribed scan and direction from the pulse sequence server 910 to produce RF pulses of the desired frequency, phase, and pulse amplitude waveform. The generated RF pulses may be applied to the whole-body RF coil 928 or to one or more local coils or coil arrays.

As described above, the RF system 920 can advantageously include only single-channel transmit hardware, such that the data acquired with the MRI system 900 are single transmission magnetic resonance data, from which higher quality pTx-like magnetic resonance data can be generated as described in the present disclosure.

The RF system 920 also includes one or more RF receiver channels. An RF receiver channel includes an RF preamplifier that amplifies the magnetic resonance signal received by the coil 928 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (6)$$

and the phase of the received magnetic resonance signal may also be determined according to the following relationship:

$$\varphi = \tan^{-1}\left(\frac{Q}{I}\right). \qquad (7)$$

The pulse sequence server 910 may receive patient data from a physiological acquisition controller 930. By way of example, the physiological acquisition controller 930 may receive signals from a number of different sensors connected to the patient, including electrocardiograph ("ECG") signals from electrodes, or respiratory signals from a respiratory bellows or other respiratory monitoring devices. These signals may be used by the pulse sequence server 910 to synchronize, or "gate," the performance of the scan with the subject's heart beat or respiration.

The pulse sequence server 910 may also connect to a scan room interface circuit 932 that receives signals from various sensors associated with the condition of the patient and the magnet system. Through the scan room interface circuit 932, a patient positioning system 934 can receive commands to move the patient to desired positions during the scan.

The digitized magnetic resonance signal samples produced by the RF system 920 are received by the data acquisition server 912. The data acquisition server 912 operates in response to instructions downloaded from the operator workstation 902 to receive the real-time magnetic resonance data and provide buffer storage, so that data is not lost by data overrun. In some scans, the data acquisition server 912 passes the acquired magnetic resonance data to the data processor server 914. In scans that require information derived from acquired magnetic resonance data to control the further performance of the scan, the data acquisition server 912 may be programmed to produce such information and convey it to the pulse sequence server 910. For example, during pre-scans, magnetic resonance data may be acquired and used to calibrate the pulse sequence performed by the pulse sequence server 910. As another example, navigator signals may be acquired and used to adjust the operating parameters of the RF system 920 or the gradient system 918, or to control the view order in which k-space is sampled. In still another example, the data acquisition server 912 may also process magnetic resonance signals used to detect the arrival of a contrast agent in a magnetic resonance angiography ("MRA") scan. For example, the data acquisition server 912 may acquire magnetic resonance data and processes it in real-time to produce information that is used to control the scan.

The data processing server 914 receives magnetic resonance data from the data acquisition server 912 and processes the magnetic resonance data in accordance with instructions provided by the operator workstation 902. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 914 are conveyed back to the operator workstation 902 for storage. Real-time images may be stored in a data base memory cache, from which they may be output to operator display 902 or a display 936. Batch mode images or selected real time images may be stored in a host database on disc storage 938. When such images have been reconstructed and transferred to storage, the data processing server 914 may notify the data store server 916 on the operator workstation 902. The operator workstation 902 may be used by an operator to archive the images, produce films, or send the images via a network to other facilities.

The MRI system 900 may also include one or more networked workstations 942. For example, a networked workstation 942 may include a display 944, one or more input devices 946 (e.g., a keyboard, a mouse), and a processor 948. The networked workstation 942 may be located within the same facility as the operator workstation 902, or in a different facility, such as a different healthcare institution or clinic.

The networked workstation 942 may gain remote access to the data processing server 914 or data store server 916 via the communication system 940. Accordingly, multiple networked workstations 942 may have access to the data processing server 914 and the data store server 916. In this manner, magnetic resonance data, reconstructed images, or other data may be exchanged between the data processing server 914 or the data store server 916 and the networked workstations 942, such that the data or images may be remotely processed by a networked workstation 942.

Figure 10:
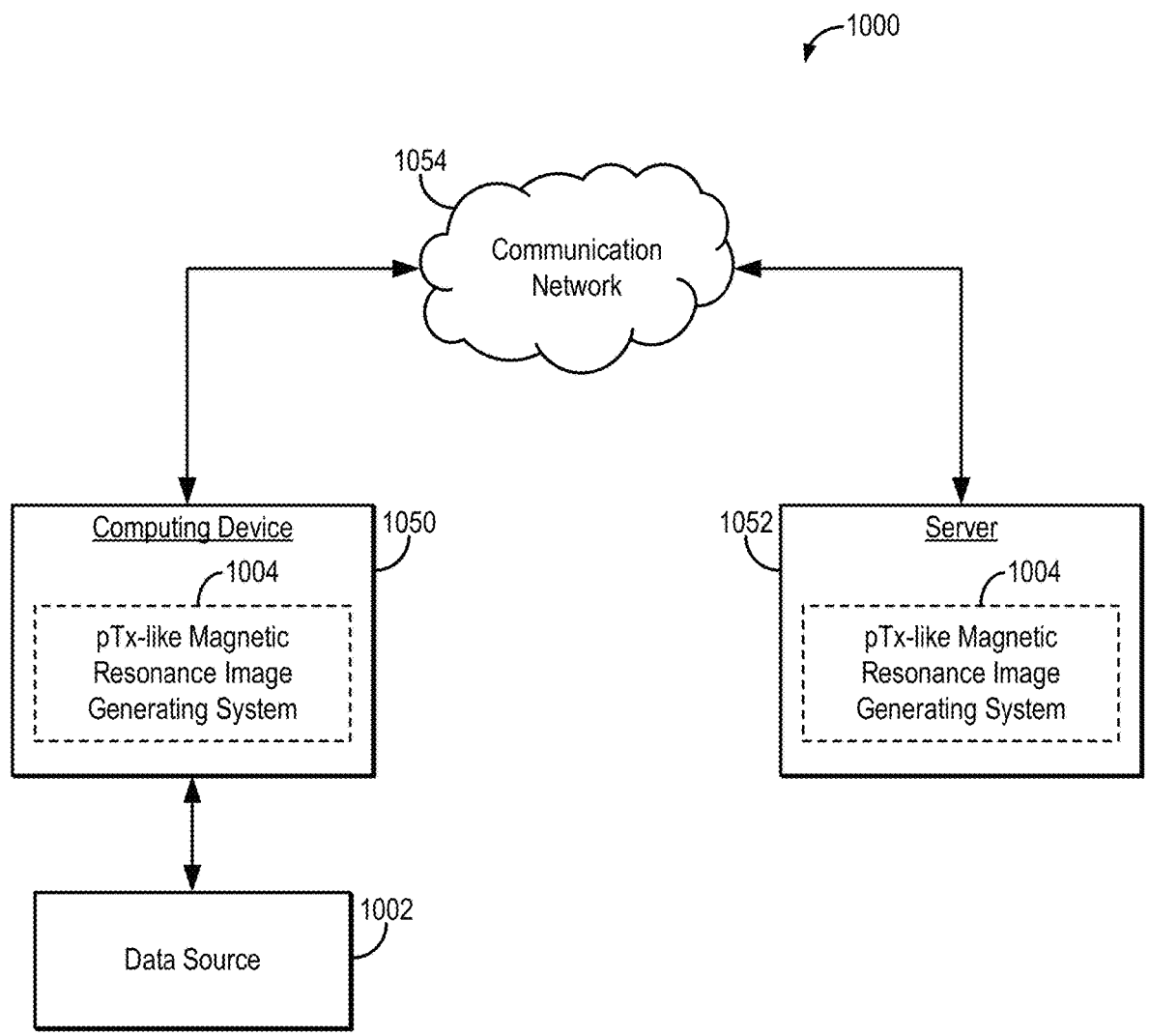
FIG. 10 is a block diagram of an example system for generating pTx-like magnetic resonance images in accordance with some embodiments described in the present disclosure.

Referring now to FIG. 10, an example of a system 1000 for generating pTx-like magnetic resonance images from single transmission magnetic resonance data in accordance with some embodiments of the systems and methods described in the present disclosure is shown. As shown in FIG. 10, a computing device 1050 can receive one or more types of data (e.g., single transmission magnetic resonance data, training data, stored neural network parameters) from data source 1002, which may be a magnetic resonance imaging data source. In some embodiments, computing device 1050 can execute at least a portion of a pTx-like magnetic resonance image generating system 1004 to generate magnetic resonance image data having quality and characteristic comparable to magnetic resonance imaging acquired using parallel transmission hardware and/or software from single transmission magnetic resonance data received from the data source 1002.

Additionally or alternatively, in some embodiments, the computing device 1050 can communicate information about data received from the data source 1002 to a server 1052 over a communication network 1054, which can execute at least a portion of the pTx-like magnetic resonance image generating system 1004. In such embodiments, the server 1052 can return information to the computing device 1050 (and/or any other suitable computing device) indicative of an output of the pTx-like magnetic resonance image generating system 1004.

In some embodiments, computing device 1050 and/or server 1052 can be any suitable computing device or combination of devices, such as a desktop computer, a laptop computer, a smartphone, a tablet computer, a wearable computer, a server computer, a virtual machine being executed by a physical computing device, and so on. The computing device 1050 and/or server 1052 can also reconstruct images from the data.

In some embodiments, data source 1002 can be any suitable source of image data (e.g., measurement data, images reconstructed from measurement data), such as an MRI system, another computing device (e.g., a server storing image data), and so on. In some embodiments, data source 1002 can be local to computing device 1050. For example, data source 1002 can be incorporated with computing device 1050 (e.g., computing device 1050 can be configured as part of a device for capturing, scanning, and/or storing images). As another example, data source 1002 can be connected to computing device 1050 by a cable, a direct wireless link, and so on. Additionally or alternatively, in some embodiments, data source 1002 can be located locally and/or remotely from computing device 1050, and can communicate data to computing device 1050 (and/or server 1052) via a communication network (e.g., communication network 1054).

In some embodiments, communication network 1054 can be any suitable communication network or combination of communication networks. For example, communication network 1054 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), a wired network, and so on. In some embodiments, communication network 108 can be a local area network, a wide area network, a public network (e.g., the Internet), a private or semi-private network (e.g., a corporate or university intranet), any other suitable type of network, or any suitable combination of networks. Communications links shown in FIG. 10 can each be any suitable communications link or combination of communications links, such as wired links, fiber optic links, Wi-Fi links, Bluetooth links, cellular links, and so on.

Figure 11:
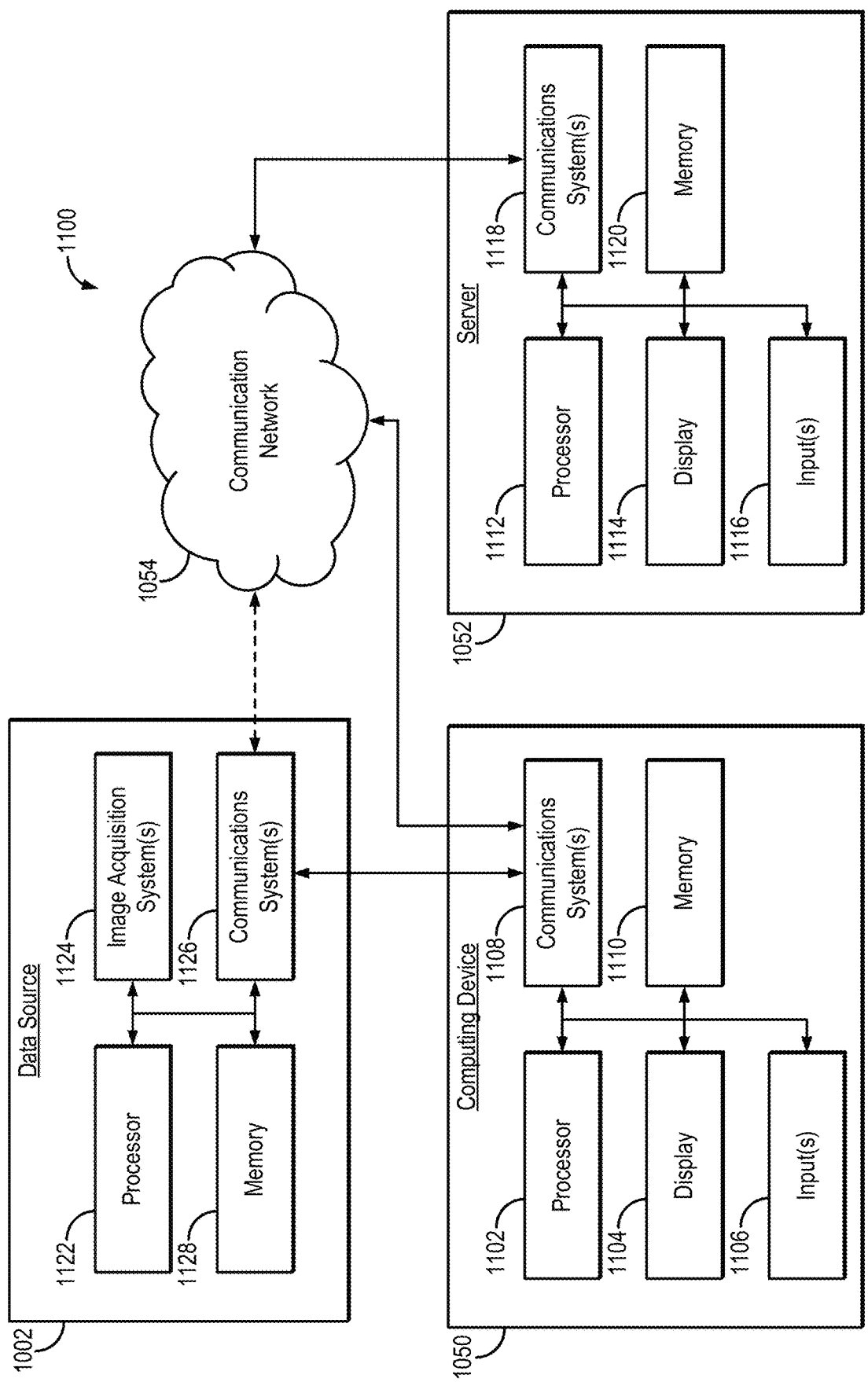
FIG. 11 is a block diagram of example components that can implement the system of FIG. 10.

Referring now to FIG. 11, an example of hardware 1100 that can be used to implement data source 1002, computing device 1050, and server 1054 in accordance with some embodiments of the systems and methods described in the present disclosure is shown. As shown in FIG. 11, in some embodiments, computing device 1050 can include a processor 1102, a display 1104, one or more inputs 1106, one or more communication systems 1108, and/or memory 1110. In some embodiments, processor 1102 can be any suitable hardware processor or combination of processors, such as a central processing unit ("CPU"), a graphics processing unit ("GPU"), and so on. In some embodiments, display 1104 can include any suitable display devices, such as a computer monitor, a touchscreen, a television, and so on. In some embodiments, inputs 1106 can include any suitable input devices and/or sensors that can be used to receive user input, such as a keyboard, a mouse, a touchscreen, a microphone, and so on.

In some embodiments, communications systems 1108 can include any suitable hardware, firmware, and/or software for communicating information over communication network 1054 and/or any other suitable communication networks. For example, communications systems 1108 can include one or more transceivers, one or more communication chips and/or chip sets, and so on. In a more particular example, communications systems 1108 can include hardware, firmware and/or software that can be used to establish a Wi-Fi connection, a Bluetooth connection, a cellular connection, an Ethernet connection, and so on.

In some embodiments, memory 1110 can include any suitable storage device or devices that can be used to store instructions, values, data, or the like, that can be used, for example, by processor 1102 to present content using display 1104, to communicate with server 1052 via communications system(s) 1108, and so on. Memory 1110 can include any suitable volatile memory, non-volatile memory, storage, or any suitable combination thereof. For example, memory 1110 can include RAM, ROM, EEPROM, one or more flash drives, one or more hard disks, one or more solid state drives, one or more optical drives, and so on. In some embodiments, memory 1110 can have encoded thereon, or otherwise stored therein, a computer program for controlling operation of computing device 1050. In such embodiments, processor 1102 can execute at least a portion of the computer program to present content (e.g., images, user interfaces, graphics, tables), receive content from server 1052, transmit information to server 1052, and so on.

In some embodiments, server 1052 can include a processor 1112, a display 1114, one or more inputs 1116, one or more communications systems 1118, and/or memory 1120. In some embodiments, processor 1112 can be any suitable hardware processor or combination of processors, such as a CPU, a GPU, and so on. In some embodiments, display 1114 can include any suitable display devices, such as a computer monitor, a touchscreen, a television, and so on. In some embodiments, inputs 1116 can include any suitable input devices and/or sensors that can be used to receive user input, such as a keyboard, a mouse, a touchscreen, a microphone, and so on.

In some embodiments, communications systems 1118 can include any suitable hardware, firmware, and/or software for communicating information over communication network 1054 and/or any other suitable communication networks. For example, communications systems 1118 can include one or more transceivers, one or more communication chips and/or chip sets, and so on. In a more particular example, communications systems 1118 can include hardware, firmware and/or software that can be used to establish a Wi-Fi connection, a Bluetooth connection, a cellular connection, an Ethernet connection, and so on.

In some embodiments, memory 1120 can include any suitable storage device or devices that can be used to store instructions, values, data, or the like, that can be used, for example, by processor 1112 to present content using display 1114, to communicate with one or more computing devices 1050, and so on. Memory 1120 can include any suitable volatile memory, non-volatile memory, storage, or any suitable combination thereof. For example, memory 1120 can include RAM, ROM, EEPROM, one or more flash drives, one or more hard disks, one or more solid state drives, one or more optical drives, and so on. In some embodiments, memory 1120 can have encoded thereon a server program for controlling operation of server 1052. In such embodiments, processor 1112 can execute at least a portion of the server program to transmit information and/or content (e.g., data, images, a user interface) to one or more computing devices 1050, receive information and/or content from one or more computing devices 1050, receive instructions from one or more devices (e.g., a personal computer, a laptop computer, a tablet computer, a smartphone), and so on.

In some embodiments, data source 1002 can include a processor 1122, one or more image acquisition systems 1124, one or more communications systems 1126, and/or memory 1128. In some embodiments, processor 1122 can be any suitable hardware processor or combination of processors, such as a CPU, a GPU, and so on. In some embodiments, the one or more image acquisition systems 1124 are generally configured to acquire data, images, or both, and can include an MRI system having a single-channel transmit RF coil. Additionally or alternatively, in some embodiments, one or more image acquisition systems 1124 can include any suitable hardware, firmware, and/or software for coupling to and/or controlling operations of an MRI system. In some embodiments, one or more portions of the one or more image acquisition systems 1124 can be removable and/or replaceable.

Note that, although not shown, data source 1002 can include any suitable inputs and/or outputs. For example, data source 1002 can include input devices and/or sensors that can be used to receive user input, such as a keyboard, a mouse, a touchscreen, a microphone, a trackpad, a trackball, and so on. As another example, data source 1002 can include any suitable display devices, such as a computer monitor, a touchscreen, a television, etc., one or more speakers, and so on.

In some embodiments, communications systems 1126 can include any suitable hardware, firmware, and/or software for communicating information to computing device 1050 (and, in some embodiments, over communication network 1054 and/or any other suitable communication networks). For example, communications systems 1126 can include one or more transceivers, one or more communication chips and/or chip sets, and so on. In a more particular example, communications systems 1126 can include hardware, firmware and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 1128 can include any suitable storage device or devices that can be used to store instructions, values, data, or the like, that can be used, for example, by processor 1122 to control the one or more image acquisition systems 1124, and/or receive data from the one or more image acquisition systems 1124; to images from data; present content (e.g., images, a user interface) using a display; communicate with one or more computing devices 1050; and so on. Memory 1128 can include any suitable volatile memory, non-volatile memory, storage, or any suitable combination thereof. For example, memory 1128 can include RAM, ROM, EEPROM, one or more flash drives, one or more hard disks, one or more solid state drives, one or more optical drives, and so on. In some embodiments, memory 1128 can have encoded thereon, or otherwise stored therein, a program for controlling operation of data source 1002. In such embodiments, processor 1122 can execute at least a portion of the program to generate images, transmit information and/or content (e.g., data, images) to one or more computing devices 1050, receive information and/or content from one or more computing devices 1050, receive instructions from one or more devices (e.g., a personal computer, a laptop computer, a tablet computer, a smartphone, etc.), and so on.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for generating magnetic resonance images, the method comprising:
   (a) accessing single transmission magnetic resonance data with a computer system, the single transmission magnetic resonance data having been acquired from a subject using a magnetic resonance imaging (MRI) system and a single-channel transmit radio frequency (RF) coil;
   (b) accessing a trained machine learning model with the computer system, the trained machine learning model having been trained to map magnetic resonance images acquired using single transmission hardware to magnetic resonance images acquired using parallel transmission hardware; and
   (c) inputting the single transmission magnetic resonance data to the trained machine learning model using the computer system, generating output as parallel transmission (pTx)-like magnetic resonance data, wherein the pTx-like magnetic resonance data have characteristics comparable to magnetic resonance images acquired using parallel transmission hardware.

2. The method of claim 1, wherein the trained machine learning model is a trained neural network.

3. The method of claim 2, wherein the trained neural network comprises a residual neural network.

4. The method of claim 2, wherein the trained neural network comprises an encoder-decoder convolutional neural network.

5. The method of claim 1, wherein the trained machine learning model is a generative adversarial network.

6. The method of claim 1, wherein the trained machine learning model is a deep learning model suitable to learn an image-to-image mapping.

7. The method of claim 1, wherein the single transmission magnetic resonance data comprise magnetic resonance images.

8. The method of claim 7, wherein the magnetic resonance images comprise images having different contrast weightings.

9. The method of claim 8, wherein the magnetic resonance images comprise T1-weighted images and diffusion-weighted images.

10. The method of claim 1, wherein the pTx-like magnetic resonance data comprise magnetic resonance images having reduced flip angle variations relative to the single transmission magnetic resonance data.

11. The method of claim 1, wherein the pTx-like magnetic resonance data comprise magnetic resonance images having reduced tissue contrast variations relative to the single transmission magnetic resonance data.

12. The method of claim 1, wherein the pTx-like magnetic resonance data comprise magnetic resonance images having reduced signal dropout relative to the single transmission magnetic resonance data.

13. A method for generating magnetic resonance images, the method comprising:
(a) acquiring single-transmission magnetic resonance images from a subject using a magnetic resonance imaging (MRI) system and a single-channel transmit radio frequency (RF) coil;
(b) accessing a trained machine learning model with a computer system, the trained machine learning model having been trained to map magnetic resonance images acquired using single transmission hardware to magnetic resonance images acquired using parallel transmission hardware;
(c) inputting the single-transmission magnetic resonance images to the trained machine learning model using the computer system, generating output as parallel transmission (pTx)-like magnetic resonance images, wherein the pTx-like magnetic resonance images have reduced signal variations associated with B1+ inhomogeneities as compared to the single-transmission magnetic resonance images; and
(d) displaying the pTx-like magnetic resonance images to a user.

14. The method of claim 13, wherein the trained machine learning model is a trained neural network.

15. The method of claim 14, wherein the trained neural network comprises a residual neural network.

16. The method of claim 14, wherein the trained neural network comprises an encoder-decoder convolutional neural network.

17. The method of claim 13, wherein the trained machine learning model is a generative adversarial network.

18. The method of claim 13, wherein the trained machine learning model is a deep learning model suitable to learn an image-to-image mapping.

* * * * *